United States Patent
Pahl et al.

(10) Patent No.: US 10,015,600 B2
(45) Date of Patent: Jul. 3, 2018

(54) MULTI-MEMS MODULE

(71) Applicant: Epcos AG, München (DE)

(72) Inventors: Wolfgang Pahl, München (DE); Gregor Feiertag, München (DE)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/111,224

(22) PCT Filed: Dec. 4, 2014

(86) PCT No.: PCT/EP2014/076603
§ 371 (c)(1),
(2) Date: Jul. 13, 2016

(87) PCT Pub. No.: WO2015/106880
PCT Pub. Date: Jul. 23, 2015

(65) Prior Publication Data
US 2016/0345106 A1   Nov. 24, 2016

(30) Foreign Application Priority Data

Jan. 16, 2014  (DE) .......... 10 2014 100 464

(51) Int. Cl.
*H04R 19/04*  (2006.01)
*H04R 1/04*   (2006.01)
(Continued)

(52) U.S. Cl.
CPC .......... *H04R 19/04* (2013.01); *B81B 7/0061* (2013.01); *H04R 1/04* (2013.01); *H04R 1/406* (2013.01); *H04R 19/005* (2013.01); *B81B 2201/0257* (2013.01); *B81B 2207/012* (2013.01); *B81B 2207/07* (2013.01); *H01L 2224/16225* (2013.01); *H01L 2224/32225* (2013.01);
(Continued)

(58) Field of Classification Search
None
See application file for complete search history.

(56) References Cited

U.S. PATENT DOCUMENTS 8,169,041 B2   5/2012  Pahl
8,611,566 B2  12/2013  Pahl
(Continued)

FOREIGN PATENT DOCUMENTS

CN   101712448 A   5/2010
CN   102187685 A   9/2011
(Continued)

OTHER PUBLICATIONS

International Search Report, PCT/EP2014/076603, dated Mar. 6, 2015 (2 pages).
(Continued)

*Primary Examiner* — Curtis Kuntz
*Assistant Examiner* — Kenny Truong
(74) *Attorney, Agent, or Firm* — Nixon Peabody LLP

(57) ABSTRACT

A multi-MEMS module is specified which can be produced expediently and enables a smaller design. The module comprises a housing having an interior and a first and a second opening, a first MEMS chip and a second MEMS chip. The first MEMS chip is acoustically coupled to the first opening. The second MEMS chip is acoustically coupled to the second opening.

11 Claims, 5 Drawing Sheets

(51) Int. Cl.
*H04R 19/00* (2006.01)
*H04R 1/40* (2006.01)
*B81B 7/00* (2006.01)
*H04R 5/027* (2006.01)

(52) U.S. Cl.
CPC ............... *H01L 2224/48091* (2013.01); *H01L 2224/48227* (2013.01); *H01L 2224/48465* (2013.01); *H01L 2224/73204* (2013.01); *H01L 2924/10158* (2013.01); *H01L 2924/16153* (2013.01); *H04R 5/027* (2013.01); *H04R 2201/003* (2013.01); *H04R 2410/03* (2013.01)

(56) References Cited

U.S. PATENT DOCUMENTS

| | | | |
|---|---|---|---|
| 8,674,464 | B2 | 3/2014 | Pahl |
| 9,278,854 | B2 | 3/2016 | Pahl |
| 2010/0086146 | A1 | 4/2010 | Gong |
| 2010/0092020 | A1 | 4/2010 | Ryan |
| 2012/0250897 | A1 | 10/2012 | Michel |
| 2012/0287303 | A1* | 11/2012 | Umeda ............... H04R 3/005 348/231.4 |
| 2013/0128487 | A1 | 5/2013 | Lo |
| 2016/0241953 | A1* | 8/2016 | Elian ................. H04R 1/083 |

FOREIGN PATENT DOCUMENTS

| | | |
|---|---|---|
| CN | 102740206 B | 11/2014 |
| DE | 102010062149 A1 | 6/2011 |
| DE | 102010026519 A1 | 1/2012 |
| DE | 112009002542 T5 | 1/2012 |
| EP | 2506598 A2 | 10/2012 |
| JP | 2007104556 A | 4/2007 |
| JP | 2012-506211 A | 3/2012 |
| WO | WO 2010/045107 A2 | 4/2010 |

OTHER PUBLICATIONS

International Preliminary Report in Patentability, PCT/EP2014/076603, date of issuance of this report Jul. 19, 2016 (6 pages).

* cited by examiner

MULTI-MEMS MODULE

CROSS-REFERENCE TO RELATED APPLICATIONS

This application is a U.S. National Stage of International Application No. PCT/EP2014/076603, filed on Dec. 4, 2014, which claims the benefit of Germany Patent Application No. 10 2014 100 464.7, filed on Jan. 16, 2014, both of which are incorporated herein by reference in their entireties.

The invention relates to MEMS modules that are of compact design yet of a high performance.

MEMS (MEMS=Micro-Electro-Mechanical System) modules are suitable for use wherever relatively complex technical objectives are to be achieved, but only little space is available. In mobile communication devices, for example, MEMS modules can be used as ambient pressure sensors, as acceleration sensors or as acoustic sensors such as microphones.

The patent specification U.S. Pat. No. 8,169,041 discloses e.g. packaged MEMS microphones, the housing being formed with the aid of laminated films.

The publication DE 10 2010 026 519 A1 likewise discloses packaged MEMS microphones.

There are modern communication devices and portable computers which comprise a plurality of microphones in order to achieve a reduction of interference signals by means of signal processing. In this case, individual microphone components are installed in the corresponding device and interconnected via signal lines into devices accommodating the microphone components.

The use of a multiplicity of individual components in a device causes increased costs and a relatively high space consumption and results in a more complex and more space-intensive and more fault-susceptible interconnection.

It is therefore an object of the present invention to specify a module as component which causes lower costs in production, mounting and interconnection, facilitates a reduction in the size of devices and at the same time offers additional functions.

This object is achieved by means of a multi-MEMS module according to claim 1. Dependent claims specify advantageous configurations.

The multi-MEMS module comprises a housing having an interior and a first and a second opening. The module furthermore comprises a first MEMS chip, which is acoustically coupled to the first opening, and a second MEMS chip, which is acoustically coupled to the second opening. Furthermore, the multi-MEMS module contains an ASIC chip (ASIC=Application Specific Integrated Circuit). Part of the module is likewise a circuit having signal lines which interconnect the two MEMS chips with the ASIC chip.

In this case, module denotes a component which comprises a plurality of component parts—here specifically at least one housing and three chips—and fulfils specific tasks by means of electrical and/or electromechanical component structures and can be interconnected with an external circuit environment.

Opening is understood to mean a connection of the interior of the component to the environment of the component, via which connection e.g. a particle exchange between the module and its environment is possible. However, it is also possible for the opening to be hermetically sealed as long as information e.g. about changes in air pressure or sound can be passed on through the opening into the interior of the housing. In this case, the opening can comprise a grid structure that protects the interior of the module against objects or particles in the environment of the module. However, the opening can also comprise a cover such as a membrane, for example, such that sound information can penetrate into the interior of the module, while harmful influences such as moisture or dirt are prevented from entering. In the simplest case, however, the opening is embodied simply merely as a hole or channel in the housing of the module.

Since the first MEMS chip is acoustically coupled to the first opening, air pressure fluctuations or sound waves can act directly on the first MEMS chip in the module. In this case, the first MEMS chip can be arranged directly and in direct proximity relative to the first opening in the interior of the housing, in the first opening itself or at the outer side of the housing. The same applies to the second MEMS chip and the second opening. At all events the two MEMS chips can ascertain pressure differences in the ambient pressure of the module via the two openings. By virtue of the fact that the individual chips are assigned to different openings, and by virtue of the fact that sound waves or pressure differences have finite propagation speeds in a gas mixture, the two chips can generate different electrical response signals on account of the corresponding propagation time difference. By evaluating said response signals in the ASIC chip, it is then possible to determine a resulting signal of improved quality or to calculate indications of the original direction of the sound signal.

The circuit having the signal lines can comprise an interconnection of the MEMS chips among one another and an interconnection of each individual MEMS chip with the ASIC chip, without the MEMS chips having to be interconnected directly with one another.

In this case, the signal lines can be information lines and/or supply lines via which component structures of the MEMS chips are operated with a supply voltage or a current.

In contrast to previous solutions with individual microphones each having a dedicated ASIC chip in a device, a multi-MEMS module is now specified in which at least two MEMS chips and an ASIC chip having an evaluation circuit for the signals of the MEMS chips are specified. In this case, the present module generally has more compact dimensions than two individual MEMS components and a simplified electrical interconnection thereof. Likewise, just a single ASIC chip is required for processing the electrical signals of the MEMS chips. Furthermore, it is possible to determine original directions of sound or changes in air pressure despite the small propagation time differences resulting from the small structural size. The properties are improved since the microphone manufacturer can select the MEMS chips better with regard to pairwise parameter synchronism, e.g. for stereophonic or direction-dependent sound evaluation, compared with the capability of the device manufacturer to do this for the individual microphones.

In one embodiment, the multi-MEMS module is embodied as a MEMS microphone for stereophonic sound evaluation. The two MEMS chips then comprise electroacoustic transducers. Such a transducer can comprise a flexible membrane and a relatively rigid back plate. The membrane and the back plate can be subjected to an electrical charge via the ASIC chip and be electrically insulated from one another. As a result, they constitute an electrical capacitor. If the membrane reacts to a change in air pressure, by said membrane being excited to oscillation e.g. by received sound waves, then the distance relative to the back plate changes in succession over time, which brings about an in-phase change in the capacitance of the capacitor. A received acoustic signal can thus be converted into an electrical signal by means of an evaluation circuit in the ASIC chip.

In one embodiment, the module comprises a first back volume, which is acoustically coupled to the first MEMS chip. It is possible for the first back volume to be coupled exclusively to the first MEMS chip, or for it also to be coupled to the second MEMS chip.

A back volume which generally should be configured to be as large as possible, is advantageous in order that the flexible membrane is restricted in its freedom of movement as little as possible by a counterpressure that acts on the membrane from the interior of the module. In this case, the counterpressure is brought about by the compression of the medium present in the interior of the module and is all the greater, the larger the membrane stroke in comparison with the back volume.

In one embodiment, the multi-MEMS module comprises a second back volume, which is acoustically coupled to the second chip and is isolated form the first chip. In that case, the first chip reacts to acoustic signals that reach it through the first opening. Acoustic signals received at the second opening act on the second MEMS chip. The first back volume and the second back volume are acoustically decoupled, i.e. pressure differences in the first back volume do not disadvantageously affect the second MEMS chip, while pressure differences in the second back volume do not adversely affect the first MEMS chip. Therefore, the chips react exclusively to the acoustic signals entering via the corresponding openings and do not mutually interfere with one another. For the decoupling of the back volumes, corresponding precautions, e.g. partitions, are provided in the interior of the module housing.

In one embodiment, the housing comprises a monolayer carrier substrate having a signal line at its top side and/or its underside. However, it is also possible for the housing to comprise a multilayer carrier substrate having signal lines at its underside, at its top side and/or in internal metallization layers in intermediate layers of the carrier substrate.

It is known that the signal disturbances caused by a counterpressure in the back volume are all the greater, the smaller the back volume. However, if more than one MEMS chip is integrated in a module, then this results not only in the problem of arranging a back volume that is as large as possible in the housing. Rather, two back volumes have to be provided, which preferably do not mutually influence one another, that is to say which are acoustically decoupled. In this case, the partitions correspondingly provided for the decoupling cause further difficulties in the development of an acoustically active MEMS module: on the one hand, the MEMS chips are to be acoustically decoupled from one another, while on the other hand they have to be electrically interconnected with one another at least via a common ASIC chip. Signal lines which overcome the acoustic barrier are therefore necessary. It has been discovered that such signal lines can be arranged at a top side or in intermediate layers of a carrier substrate and thus, on the one hand, a good electrical interconnection can be achieved and, on the other hand, a good acoustic decoupling of the acoustically active components can be maintained. In this case, the signal lines can be embodied at least in sections as bonding wires or as structured metallizations and—if different structures at different vertical heights have to be connected—as plated-through hole or via.

In one embodiment, the multi-MEMS module comprises a cap. The cap is part of the housing and can bear on a carrier substrate. In this case, the cap and the carrier substrate substantially enclose a back volume, e.g. the first back volume for the first MEMS chip.

Furthermore, it is possible for a depression to be provided in a carrier substrate which constitutes a part of the housing, a MEMS chip being arranged in said depression. In that case, either a cap can be arranged on the carrier substrate and, together with the depression, enclose a back volume. On the other hand, however, it is also possible for just a flat cover to cover the depression with MEMS chip arranged therein and nevertheless to form a sufficiently large back volume.

Furthermore, it is possible for at least one of the MEMS chips to be enveloped by a film encapsulation such that the chip has a back volume in its own interior or in a cavity below the film encapsulation.

These housing possibilities mentioned for forming a back volume can be provided just for one of the two MEMS chips or else for both MEMS chips. It is thus possible for a corresponding back volume for each individual chip to be formed by a cap, a depression or a film encapsulation, while a back volume for the respective other chip is likewise formed by a cap, a depression or a film encapsulation.

In one embodiment, the module comprises a first back volume and a second back volume acoustically decoupled therefrom. In this case, a partition between the two back volumes is provided in a cap as part of the housing or in a depression in a carrier substrate as part of the housing. It is alternatively or additionally also possible for the ASIC chip to be arranged between both back volumes such that it serves as a decoupling element part of the corresponding acoustic barrier between the back volumes.

In this case, it is possible for interfaces between substrate and partition as part of the cap or between cap and partition as part of the substrate to be sealed by an adhesive or a solder layer. If the ASIC chip is part of the decoupling element, then the ASIC chip can also be connected to parts of the partition, of the substrate or of the cap by means of an adhesive connection or a soldering connection.

In one embodiment, at least one of the two openings is formed at the underside of the module in a carrier substrate, at the top side of the module in a cap or in a film encapsulation or at a side wall of the module in a cap or a film encapsulation.

If the module has its openings at the top side, then this is referred to as a top port module. If its openings are situated at the underside, then this is referred to as a bottom port module. Depending on the orientation in which the module is interconnected and arranged in an external circuit environment, a configuration as a top port module or as a bottom port module may be advantageous. The fact that the module comprises two openings and correspondingly two MEMS chips associated therewith is not influenced thereby. The orientation of the MEMS chips within the module is advantageously chosen so as to obtain a good signal quality in conjunction with minimized mutual influencing and maximum back volume.

In one embodiment, the first MEMS chip seals the first opening from the inside. The second MEMS chip seals the second opening from the inside. The housing comprises a carrier substrate and a cap having a transverse web for acoustically decoupling the two MEMS chips. Signal lines between the MEMS chips and the ASIC chip are led at least in sections on the surface of the carrier substrate and below the transverse web or through an intermediate layer in the carrier substrate.

Since the first MEMS chip seals the first opening from the inside, an acoustic channel that would otherwise have to guide the acoustic signals from the first opening to the first MEMS chip can virtually be dispensed with. It is thus possible for the module to comprise a carrier substrate of greater or lesser thickness with the first opening therein and for the first MEMS chip to be seated in the interior of the module directly on the carrier substrate above the opening. The same correspondingly applies to the second MEMS chip and the second opening. The cap is arranged on the carrier substrate and seals with the carrier substrate all around such that back volumes formed in the interior have low contact with the environment of the module apart from via the corresponding two openings. A transverse web is arranged in the cap and is thus part of the cap, wherein the transverse web substantially subdivides the interior of the module into the first back volume and the second back volume. In this case, the transverse web is embodied so solidly that sound waves of the second back volume do not reach the first MEMS chip, and vice versa. For this purpose, the transverse web also seals at least partly with the surface of the carrier substrate or, if appropriate, with the top side of the ASIC chip if the latter lies in the region of the transverse web. In that case, the underside of the ASIC chip is also connected to the top side of the carrier substrate in an acoustically sealed fashion.

The problematic interconnection of the MEMS chips with one another or with the ASIC chip can then be realized as metallization at an outer side of the carrier substrate or in a central or inner layer of the carrier substrate. Such a signal line embodied as structured metallization has an extremely small structural height, such that it can easily be led through below the transverse web without jeopardizing the acoustic decoupling.

In one embodiment, the housing of the module comprises a carrier substrate, on the top side of which the MEMS chips are arranged. The ASIC chip is either arranged on the top side of the carrier substrate or embedded in the carrier substrate. If the ASIC chip is arranged on the top side of the carrier substrate, it is advantageous to arrange it between the MEMS chips such that it functions as part of the acoustic barrier. A corresponding transverse web in the cap or an acoustic barrier realized in some other way can be realized in a correspondingly simplified manner and in a manner embodied with less material.

In one embodiment, the multi-MEMS module comprises four MEMS chips. In this regard, two further MEMS chips are provided in addition to the first and second MEMS chips. The first, the second and the two further MEMS chips are arranged around the ASIC chip, e.g. in a manner lying in one plane. At least two of the MEMS chips close off an opening of the module from the inside, e.g. by their being arranged on a carrier substrate with a hole therein as opening.

It is furthermore possible for the module to comprise two further openings, which are assigned to the corresponding other MEMS chips and which are arranged at the top side of the module, e.g. in a cap or in a film encapsulation. In that case, the upper two openings can receive particularly well sound that originates from a source above the module, while the other two openings receive sound that originates from a source below the module.

Lateral openings are likewise possible, such that modules can be obtained which, independently of their orientation with respect to different sound waves, can always firstly receive sound well and secondly permit conclusions about the location of the origin of the sound.

The four chips can be arranged at the four corner points of an imaginary square, or more generally: at the four corner points of a rectangle, around the ASIC chip.

In one embodiment, the ASIC chip of the module comprises circuits for voltage supply and signal amplification for all MEMS chips of the module.

In contrast to conventional solutions with a multiplicity of individual components and, if appropriate, additional ASIC chips, now a single ASIC chip suffices for voltage supply and signal evaluation of all MEMS chips, such that space and costs are saved and the signal processing takes place centrally. The configuration of the MEMS chips relative to one another is in this case already known during the development of the multi-MEMS module, such that optimally operating signal processing algorithms which take account of the specific geometrical arrangement of the chips with respect to one another can already be developed on the part of the developers of the module.

In one embodiment, the module comprises at least one outer enclosure that is mechanically stable enough that the module is well protected against external influences. The module can furthermore comprise a metallization layer on its surface, which is interrupted at most by metallization pads for contacting with an external circuit environment, such that a good protective effect against electromagnetic interference is obtained. In this case, the contact pads for interconnection with an external circuit environment can be realized by SMT soldering pads (SMT=Surface Mounted Technology) or by bonding pads. Furthermore, the module can have a redistribution layer in order to be able to be adapted to a multiplicity of different circuit topologies of an external circuit environment.

If signal lines run from or to MEMS chips embodied with extremely high impedance directly at a top side or in metallization layers within a carrier substrate, then the carrier substrate preferably has a particularly low electrical conductivity. Likewise, all materials which are not provided for conducting electrical signals and are in direct contact with the signal lines have a low conductivity, that is to say a high resistivity. However, it is also possible to use relatively expedient substrate materials. In that case, additional conductor structures spatially surrounding the signal lines in two or three dimensions can be provided and be at a ground potential for an improved electrical shielding.

It is even more advantageous to apply to these surrounding conductor structures the same potential as that of the signal lines, but from a source of lower impedance. An electrical protective structure "guarding" is thus obtained.

A substrate having a particularly high degree of insulation is, for example, a substrate comprising a ceramic.

The chips can be adhesively bonded on a carrier substrate or connected to the substrate by means of a solder connection. It is also possible for the chips to be soldered to connection pads at the surface of the substrate using flip-chip technology. The ASIC chip can thus be connected for example via a bump connection to connection areas at the top side of the substrate. The cap, too, can be connected to the top side of the substrate by means of adhesive or a solder material.

If the chips are arranged on a carrier substrate using flip-chip technology, then film laminate encapsulations which are applied over the rear sides of the corresponding chips and seal tightly with the top side of the substrate are well suited. In this case, a film laminate encapsulation can comprise a plurality of partial layers, e.g. a polymer film, a sputtered metallic adhesion and/or plating start layer and electrochemically deposited reinforcement layers composed of metal. The latter also serve for electromagnetic shielding. Furthermore, it is possible to remove a polymer film before the application of further partial layers in the edge region of the module, namely where a tight seal between film or some other form of encapsulation and carrier substrate is desirable, such that further metallic partial layers are directly connected to the substrate. In that case, it is also easily possible to interconnect a metallic partial layer with ground connection pads on the top side of the carrier substrate.

In the case of flip-chip mounting, the ASIC chip can be acoustically tightly connected to the substrate by the application of an underfiller between substrate and chips.

The entire module can furthermore also have a glob top potting.

In addition to the MEMS chips or ASIC chips mentioned previously, the module can comprise further chips, further signal lines and further openings and back volumes in order to fulfill more specific requirements with regard to a sound evaluation. Particularly in the case of spatially complex acoustic interference signals, a multi-MEMS module which yields a better signal quality than previous MEMS modules can thus be obtained.

The arrangement of the chips relative to one another and/or of the openings relative to one another and relative to the chips is preferably symmetrical with respect to mirror planes; back volumes are preferably of the same size and the MEMS chips are preferably of the same type in order that the electronic signal conditioning is facilitated.

The basic principles of the invention and some possible configurational forms, which do not preclude other configurational forms, are illustrated schematically hereinafter. Therefore, for the sake of clarity, explicit illustration of internal circuits, external connections, etc. is dispensed with in part.

In the figures:

FIG. 1 shows a multi-MEMS module having two MEMS chips each respectively above an opening in the module housing, FIG. 2 shows a module having two acoustically decoupled back volumes, FIG. 3 shows a module having two back volumes, wherein each chip is connected only to a single back volume, FIG. 4 shows a module in which the housing is formed by a carrier substrate and a cap, FIG. 5 shows a module in which the ASIC chip is interconnected with and connected to connection pads on the carrier substrate by means of bump connections, FIG. 6 shows a module in which decoupled back volumes are formed by trough-shaped depressions in a carrier substrate, FIG. 7 shows a module in which the ASIC chip is embedded in a carrier substrate, FIG. 8 shows a module in which the housing is formed by a carrier substrate and a film encapsulation, FIG. 9 shows a module in which the housing is carried out with the aid of a film encapsulation and parts of the film encapsulation also bring about the acoustic decoupling of the back volumes, FIG. 10 shows a module having an alternative embodiment of a film encapsulation, FIG. 11 shows a module having openings at the top side of the module, FIG. 12 shows a module having laterally provided openings, FIG. 13 shows a module in which a film encapsulation is drawn down between MEMS chips and the ASIC chip right onto the top side of the carrier substrate, FIG. 14 shows two different possible arrangements of the openings.

FIG. 1 shows a multi-MEMS module MMM having a first MEMS chip MC1 and a second MEMS chip MC2. The first MEMS chip MC1 is coupled to a first opening O1 by virtue of the fact that the first opening O1 constitutes a hole in the housing G and the first MEMS chip MC1 is arranged directly on the inner side of the housing above the opening O1. The same applies to the acoustic coupling of the second MEMS chip MC2 to the second opening O2. If the two MEMS chips are MEMS transducers of a microphone, then the chips comprise a generally perforated, relatively stiff back plate and a flexible and oscillatory membrane that is caused to oscillate by the action of external sound waves. By virtue of the fact that the MEMS chips are acoustically coupled to the corresponding openings, the MEMS chips can transmit electrical signals to the ASIC circuit in the ASIC chip which are specific for the corresponding openings O1, O2.

A single, namely a first, back volume RV1 is formed in the interior I of the housing G, said back volume being large enough to give the membranes of the MEMS chips the possibility of oscillation. Via signal lines SL, which can be formed for example by bonding connections, a circuit is provided between the MEMS chips and the ASIC chip.

FIG. 2 illustrates the separation of a first back volume RV1 from a second back volume RV2 within the housing G. The first back volume RV1 is coupled to the first MEMS chip MC1 and at least partly to the second MEMS chip MC2. The degree of coupling of the first back volume RV1 to the second chip can be set as required, e.g. by the position of the acoustic barrier being chosen accordingly. In this regard, it is possible for only the chip housing or else a membrane present in the chip to be wholly coupled, partly coupled or not coupled at all. In this case, the second back volume RV2 is exclusively coupled to the second MEMS chip MC2. The decoupling by means of the acoustic barrier AB effectively prevents a mutual and generally disadvantageous influencing of the acoustically active component structures of the two MEMS chips.

FIG. 3 shows an embodiment in which the back volumes RV1, RV2 are separated from one another by an acoustic barrier AB such that the first back volume RV1 interacts exclusively with component structures of the first MEMS chip MC1, but not with component structures of the second MEMS chip MC2. Analogously there is no interaction between component structures of the first MEMS chip MC1 and the second back volume RV2. In addition, identical back volumes RV1, RV2 can result from a possible symmetrical construction. A symmetrical construction may therefore be preferred.

FIG. 4 shows an embodiment of a module MMM in which the housing is formed partly by a carrier substrate TS. The other part of the housing is formed by a cap K seated on the carrier substrate TS. The first opening and the second opening O2 are formed by sound entrance openings, e.g. holes, at the corresponding positions in the carrier substrate. The corresponding MEMS chips are seated directly above the opening, such that a corresponding sound signal that can be assigned to the corresponding opening can be processed directly. In this case, the cap comprises transverse webs QS, which separate the back volumes assigned to the MEMS chips from one another. Furthermore, a further volume is formed, in which the ASIC chip ASIC is arranged. The problem that the back volumes RV1, RV2 assigned to the MEMS chips have to be insulated from one another, but that on the other hand an electrical interconnection of the MEMS chips contained therein is necessary, is solved by signal lines SL embodied at least partly as metallizations ML. The metallizations can be led at the top side of the carrier substrate below the transverse webs through the acoustic barrier. In the present example, however, the signal lines in sections are embodied as structured metallizations in metallization layers ML in the interior of the multilayer carrier substrate TS. In this case, the carrier substrate should have a sufficiently high electrical resistivity in order that an electrical influencing of the signal lines is kept as small as possible. This likewise applies to metallizations at a surface of the module. It has been discovered that a carrier substrate TS comprising ceramic material may have sufficiently high resistivities.

FIG. 5 shows an embodiment of a module MMM in which the ASIC chip ASIC is interconnected with the MEMS chips in a flip-chip arrangement by means of bump connections BU and by means of vias V in the carrier substrate TS. The cap K is connected to the carrier substrate TS by an adhesive KL or a solder material tightly enough that the corresponding back volumes are sufficiently isolated from one another.

Different connection possibilities or the same connection possibilities may be appropriate for the connection of the MEMS chips to the substrate and of the ASIC chip ASIC to the substrate.

FIG. 6 shows an embodiment in which the back volumes RV1, RV2 of the two MEMS chips MC1, MC2 are formed by depressions V1, V2 in the carrier substrate TS. In this case, a simple cover D suffices, which covers the depressions V1, V2 such that the back volumes RV1, RV2 are acoustically decoupled. Signal lines between the chips can be led through structured metallizations on the surface of the carrier substrate or through intermediate layers of the carrier substrate. The ASIC chip is present but is not shown in the figure. It can find space in a depression or be embedded into the substrate.

It is furthermore possible for the back volumes to be embodied both by depressions in the carrier substrate and by cap-shaped coverings with transverse webs. The substrate and the cap themselves then need only have depths that are smaller than the corresponding structural heights of the chips. In this regard, carrier substrate TS and cap can be produced more simply.

FIG. 7 shows a module MMM in which the ASIC chip ASIC is embedded in the interior of the carrier substrate TS. A single transverse web QS then suffices as an acoustic barrier AB between the two back volumes RV1, RV2. Alternatively, two separate caps can also be emplaced. If the carrier substrate is embodied as a multilayer carrier substrate, e.g. on an organic basis, then the corresponding ASIC chip ASIC can easily be integrated in the carrier substrate TS.

FIG. 8 shows an embodiment of a module MMM in which the housing of the module is achieved with the aid of a film F and a carrier substrate TS. The MEMS chips and the ASIC chip ASIC are arranged on the top side of the carrier substrate TS. On account of the used flip-chip mounting on solder balls, the front volume is not limited laterally in the connecting plane. The film F is arranged above the top sides of the carrier substrate TS, of the two MEMS chips and of the ASIC chip ASIC such that an all-round tight seal of the film F with the carrier substrate TS is obtained. On its top side, the ASIC chip seals tightly with the film F. Below the ASIC chip and between chip and carrier substrate TS a filling material, e.g. an underfiller, is arranged as an acoustic barrier AB between the chips.

In this case, the MEMS chips comprise back volumes that are arranged in a well defined and separated manner in chip-internal deep etches. FIG. 8 shows a cross section through a component; toward the front and rear relative to the plane of the drawing the laminate seals from the flanks of the ASIC chip ASIC via the underfilling AB toward the substrate TS.

FIG. 9 shows a module MMM in which the housing is likewise effected using a film. In contrast to the embodiment in FIG. 8, the acoustic barrier AB between the back volumes and/or between the front volumes, i.e. the volumes in front of the electroacoustically active structures of the chips, is realized by a further film F drawn over the ASIC chip. In this case, the further film F is drawn down at the flanks of the ASIC chip ASIC to an extent such that it seals tightly with the top side of the carrier substrate TS. The underfiller shown in FIG. 8 is therefore not necessary here.

The laminate layer of the module MMM shown in FIG. 9 can easily be obtained by firstly the ASIC chip ASIC being laminated in and then the laminate being removed again outside this region before the MEMS chips are mounted and the complete arrangement of the chips is laminated in a further time.

FIG. 10 shows an embodiment of the module MMM, wherein a first film is led in various sections over the MEMS chips and drawn down to an extent such that the sections seal tightly with the top side of the carrier substrate TS. As a result, the MEMS chips and the front and back volumes contained in them are separated from one another. A further film F2 covers the entire or almost the entire top side of the module MMM and protects the ASIC chip ASIC. The two MEMS chips thus have protection by a double film layer comprising the films F1 and F2.

The order of the mounting of ASIC chip and MEMS chips can also be effected, in comparison with the embodiment in FIG. 9, such that firstly the MEMS chips are mounted and laminated in. Afterward, the ASIC mounting region or else only the electrical contact pads thereof is or are exposed and the ASIC chip is emplaced. A subsequent second complete lamination then covers the totality of the chips.

Figure 1:
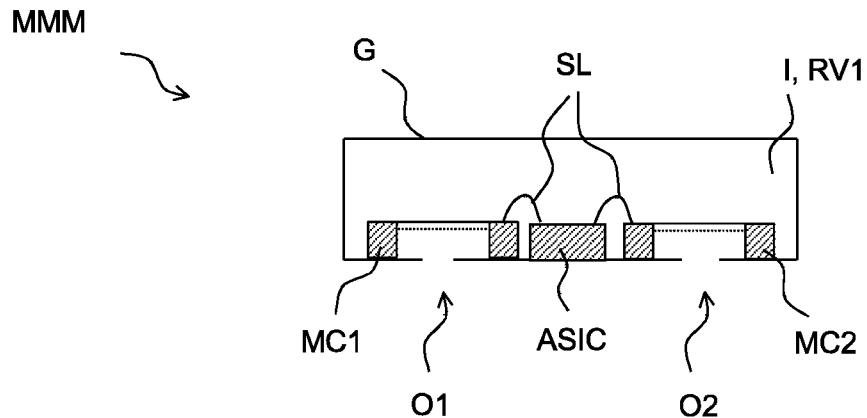
Figure 2:
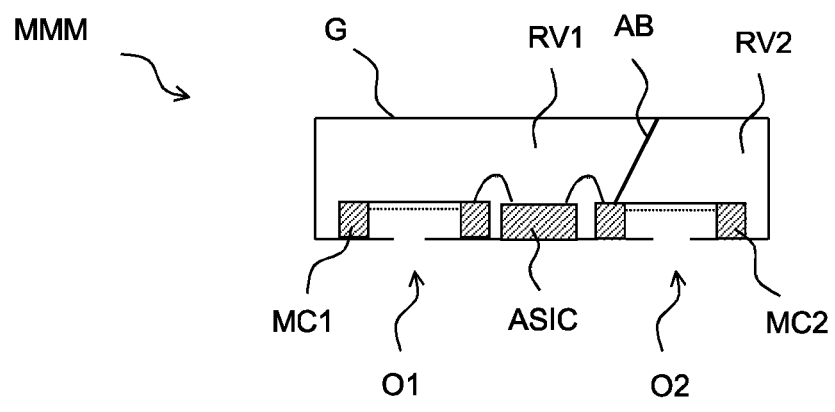
Figure 3:
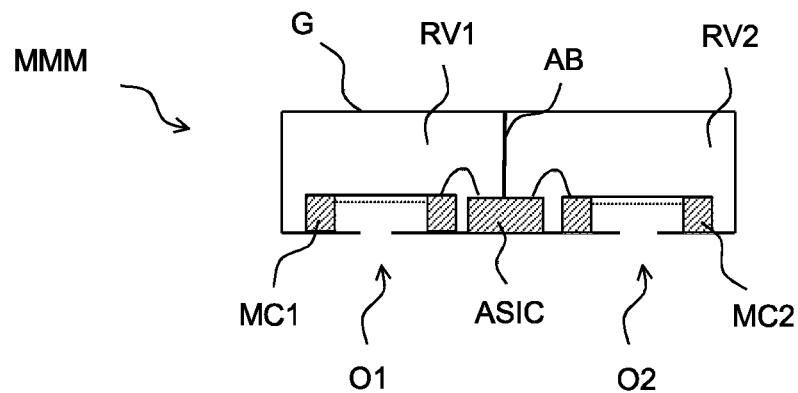
Figure 4:
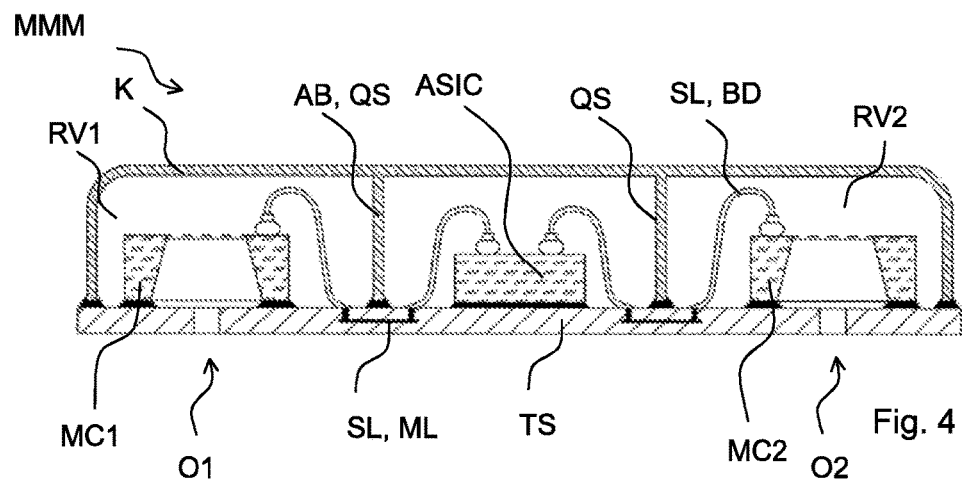
Figure 5:
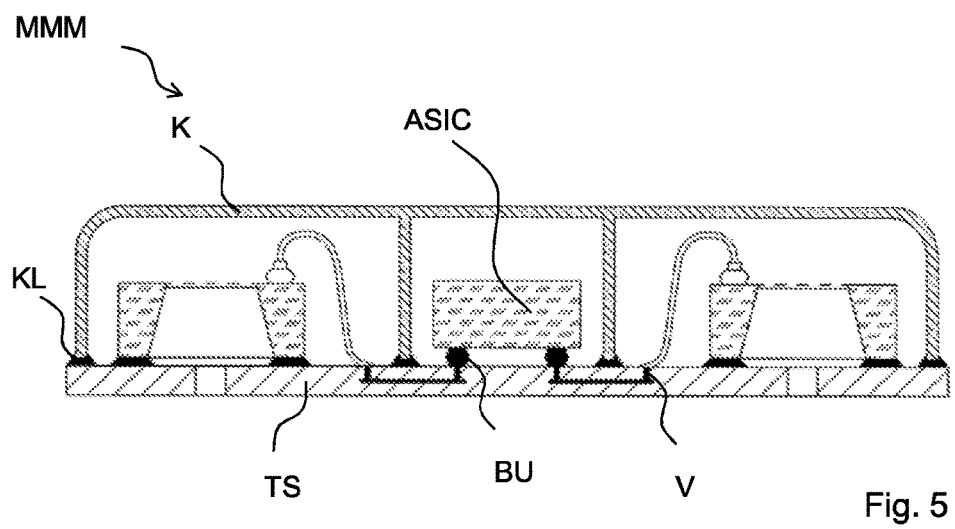
Figure 6:
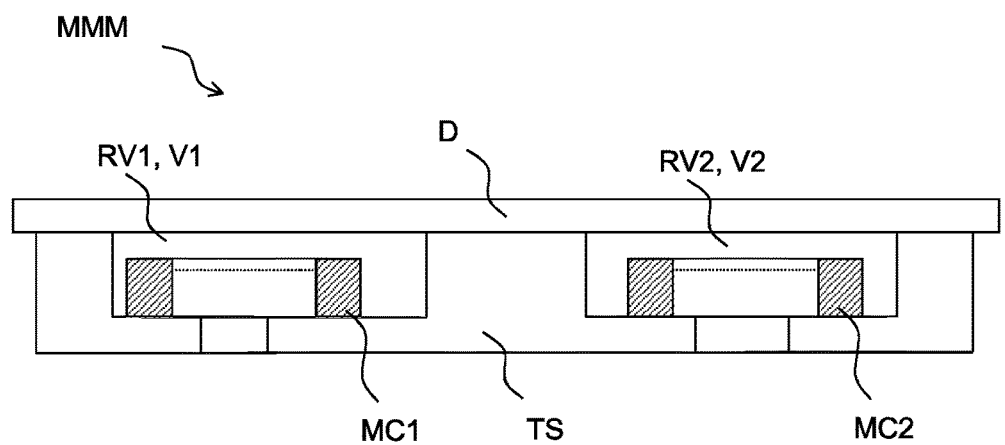
Figure 7:
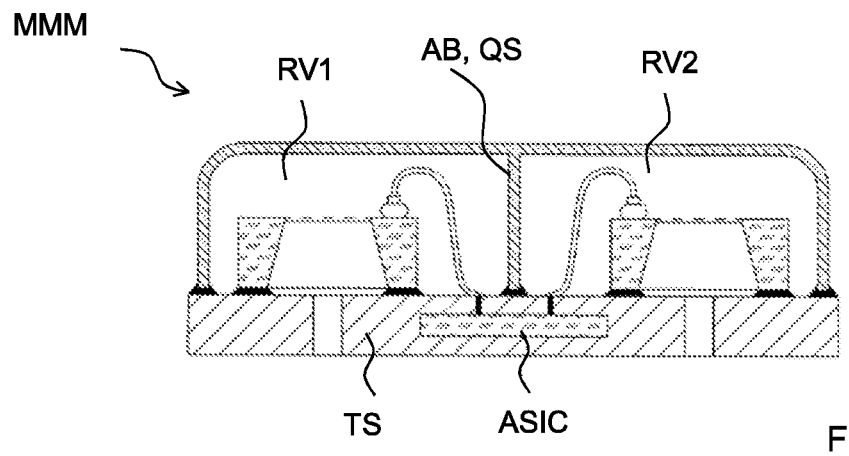
Figure 8:
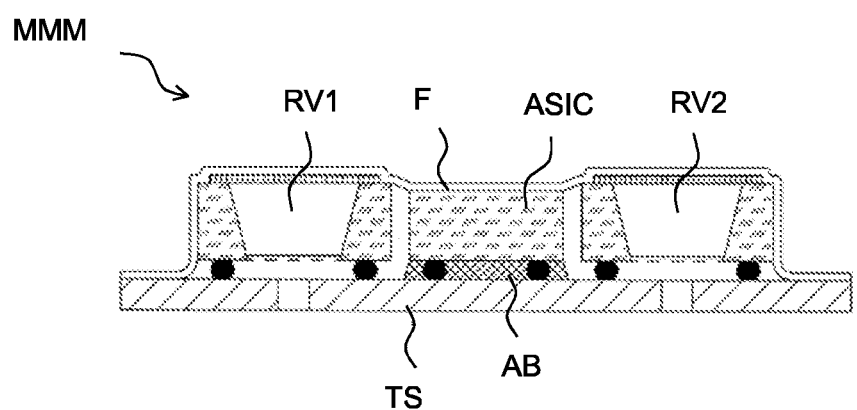
Figure 9:
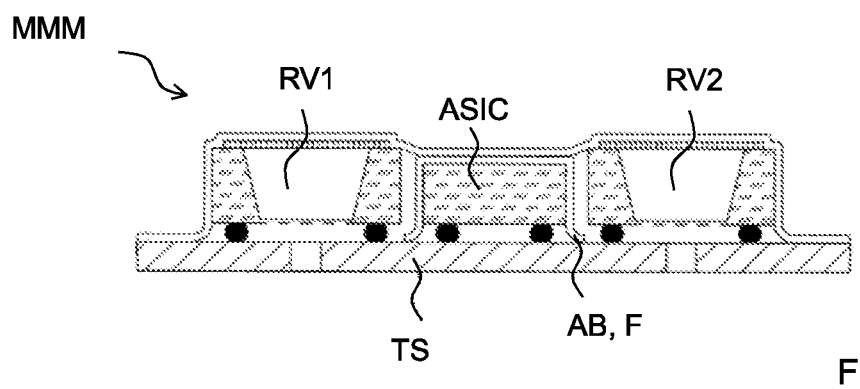
Figure 10:
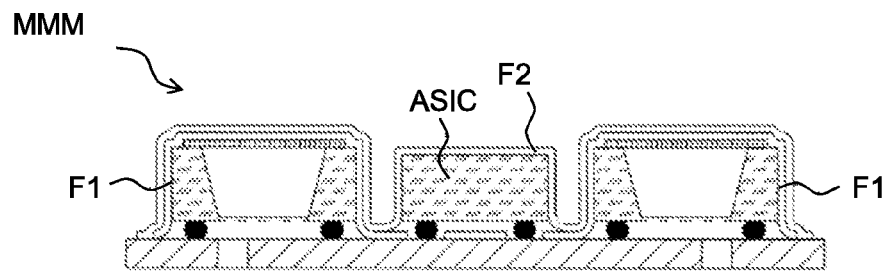
Figure 11:
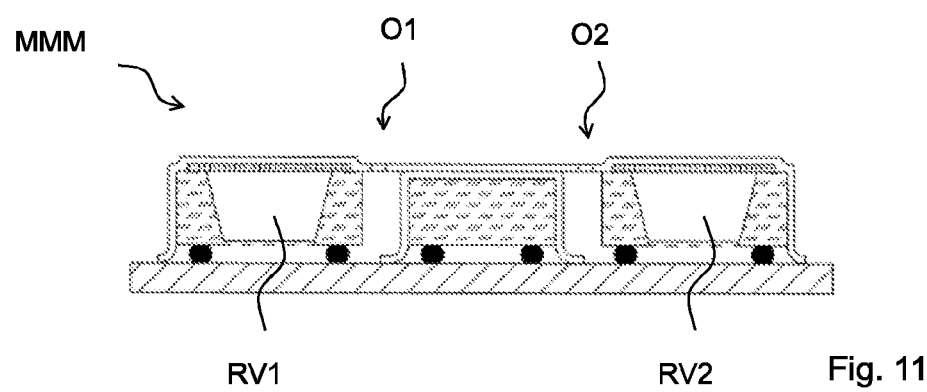
FIG. 11 shows an embodiment of the multi-MEMS module MMM in which the openings O1, O2 are embodied by holes in a film covering at the top side of the module MMM. Such a module constitutes a so-called top port module.
Figure 12:
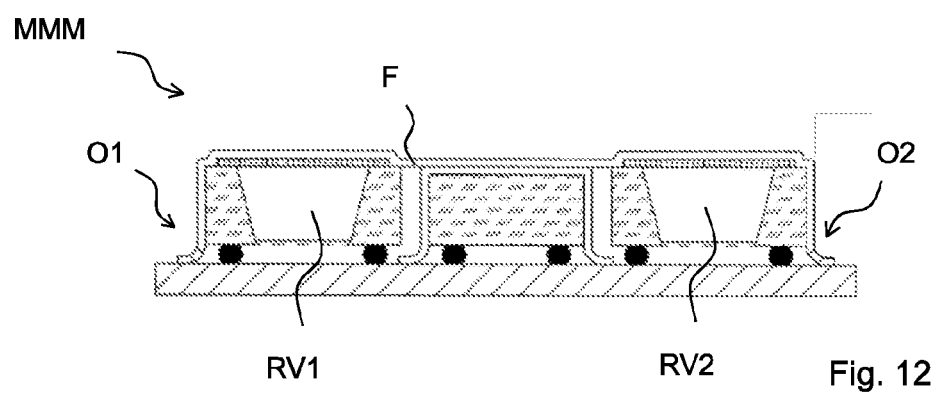
FIG. 12 shows an embodiment in which the two openings O1, O2 are arranged laterally at the module MMM and are realized in the form of holes in a laminate film F.
Figure 13:
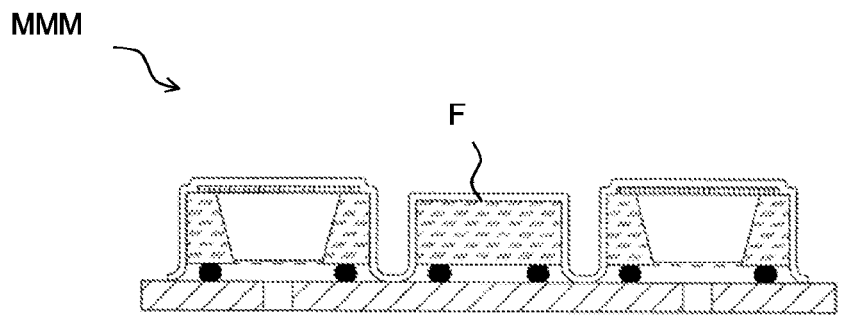
FIG. 13 shows an embodiment in which the housing can be realized by means of a single film layer F, which is drawn down in the regions between the MEMS chips and in particular between the MEMS chips and the ASIC chip as far as the top side of the carrier substrate in order to acoustically decouple the MEMS chips and their volumes.
Figure 14:
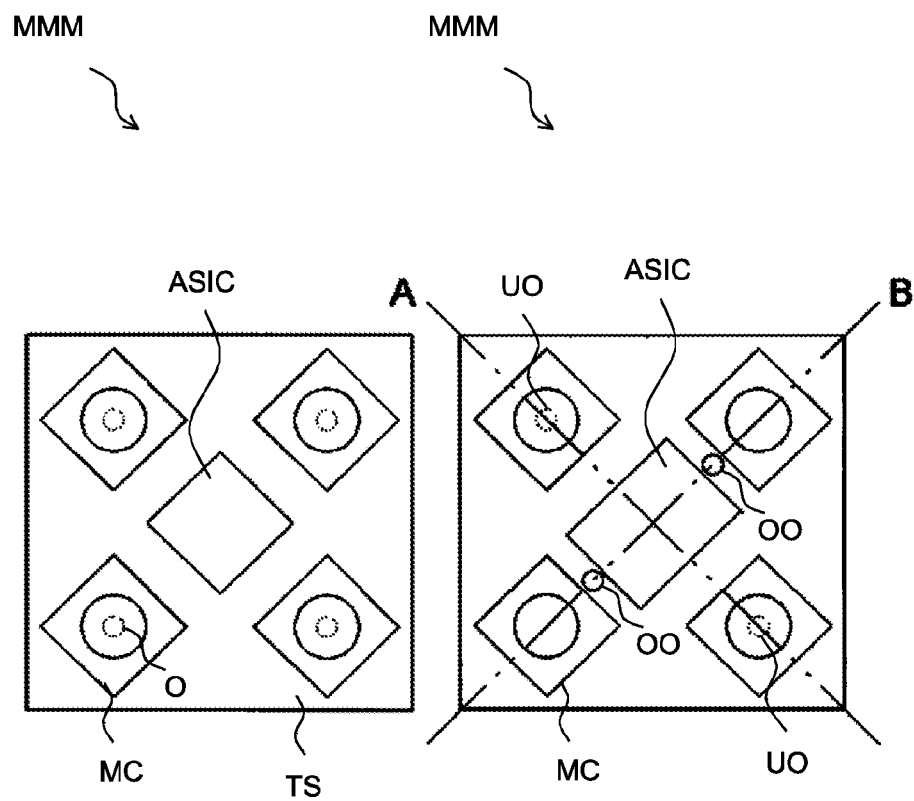

FIG. 14 shows two possible layouts, which differ from one another in the position of the openings O. The left layout shows a centrally arranged ASIC chip ASIC and four MEMS chips MC. Four openings O are present in the carrier substrate TS and arranged relative to one another in a manner corresponding to the corners of a square. The MEMS chips MC are arranged directly above the openings O such that they can directly detect acoustic signals which originate from a source below the module.

In contrast thereto, the layout on the right-hand side of FIG. 14 shows a carrier substrate having two lower openings UO embodied as holes in the carrier substrate. Above the lower openings UO two of the four chips are arranged on the carrier substrate and suitable for detecting acoustic signals from a source below the module. At the top side of the module MMM, two further openings, namely upper openings OO, are present and positioned above interspaces between MEMS chips and a centrally arranged ASIC chip ASIC. The upper openings OO can be realized for example in the form of holes in a film laminate. This module MMM can thus directly detect both acoustic signals of a source below the module and acoustic signals of a source above the module.

The multi-MEMS module is not restricted to one of the exemplary embodiments shown. In particular, the features mentioned above can be individually combined with one another and are not mutually exclusive. In this regard, a module optimized individually and optimally for a specific requirement can be obtained. Modules which comprise further chips, openings, signal lines, back volumes, etc. are likewise encompassed by the invention.

LIST OF REFERENCE SIGNS

AB: Acoustic barrier
ASIC: ASIC chip
BD: Bonding wire
BU: Bump connection
D: Cover
F, F1, F2: Film
G: Housing
I: Interior
K: Cap
KL: Adhesive/solder connection
MC: MEMS chip
MC1: First MEMS chip
MC2: Second MEMS chip
ML: Metallization layer
MMM: Multi-MEMS module
O: Opening
O1: First opening
O2: Second opening
OO: Upper opening
QS: Transverse web
RV1: First back volume
SL: signal line
TS: Carrier substrate
UO: Lower opening
V: Via
V1, V2: Depressions

The invention claimed is:

1. A multi-MEMS module, comprising
    a housing having an interior and a first and a second opening, the housing including a carrier substrate,
    a first microelectromechanical system (MEMS) chip, which is acoustically coupled to the first opening,
    a second MEMS chip, which is acoustically coupled to the second opening, the MEMS chips being arranged on a top side of the carrier substrate,
    an application specific integrated circuit (ASIC) chip arranged on the top side of the carrier substrate between the MEMS chips, the ASIC chip being acoustically decoupled from a back volume of the first MEMS chip by a first acoustic barrier and from a back volume of the second MEMS chip by a second acoustic barrier such that the back volumes are insulated from one another,
    a circuit having signal lines which interconnect the first and second MEMS chips with the ASIC chip, where signal conductors electrically connecting the first and second MEMS chips are arranged in an interlayer of a multi-layer substrate and cross the wall's footprint.

2. The multi-MEMS module according to claim 1, which is embodied as a MEMS microphone for stereophonic sound evaluation.

3. The multi-MEMS module according to claim 1, which is embodied as a MEMS microphone for direction-dependent sound evaluation.

4. The multi-MEMS module according to claim 1, wherein the back volume of the first MEMS chip or the back volume of the second MEMS chip is formed by
    a cap as part of the housing and/or
    a depression in a carrier substrate as part of the housing and/or
    a film encapsulation bearing at least on one of the chips.

5. The multi-MEMS module according to claim 1, wherein
    a partition in a cap as part of the housing or a partition in a depression in a carrier substrate as part of the housing or
    the ASIC chip isolates the two back volumes.

6. The multi-MEMS module according to claim 1, wherein at least one of the two openings is formed
    at the underside of the module in a carrier substrate,
    at the top side of the module in a cap or in a film encapsulation or
    at a side wall of the module in a cap or in a film encapsulation.

7. The multi-MEMS module according to claim 1, wherein
    the first MEMS chip seals the first opening from the inside,
    the second MEMS chip seals the second opening from the inside,
    the housing comprises a carrier substrate and a cap,
    wherein the first acoustic barrier or the second acoustic barrier includes a traverse web, and
    signal lines between the MEMS chips and the ASIC chip are led at least in sections on the surface of the carrier substrate and below the transverse web or through an intermediate layer in the carrier substrate.

8. The multi-MEMS module according to claim 1, furthermore comprising two further MEMS chips,
    wherein
    the first and the second and the two further MEMS chips are arranged around the ASIC chip and
    at least two of the MEMS chips in each case close off an opening of the module from inside.

9. The multi-MEMS module according to claim 8, wherein the first and the second and the two further MEMS chips are arranged at four corner points of a rectangle around the ASIC chip.

10. The multi-MEMS module according to claim 1, wherein the ASIC chip comprises circuits for voltage supply and signal amplification for all MEMS chips of the module.

11. The multi-MEMS module according to claim 1, wherein the first acoustic barrier or the second acoustic barrier includes a transverse web.

* * * * *